United States Patent
Xiao et al.

(10) Patent No.: US 7,063,994 B2
(45) Date of Patent: Jun. 20, 2006

(54) ORGANIC SEMICONDUCTOR DEVICES AND METHODS OF FABRICATION INCLUDING FORMING TWO PARTS WITH POLYMERISABLE GROUPS AND BONDING THE PARTS

(75) Inventors: Steven Shuyong Xiao, Laval (CA); Chunong Qiu, Brossard (CA); Cindy Xing Qiu, Brossard (CA)

(73) Assignee: Organic Vision Inc., Brossard (CA)

( * ) Notice: Subject to any disclaimer, the term of this patent is extended or adjusted under 35 U.S.C. 154(b) by 164 days.

(21) Appl. No.: 10/617,413

(22) Filed: Jul. 11, 2003

(65) Prior Publication Data

US 2005/0009227 A1 Jan. 13, 2005

(51) Int. Cl.
*H01L 21/00* (2006.01)
*H01L 51/40* (2006.01)

(52) U.S. Cl. .............................. 438/22; 438/29; 438/82; 438/99

(58) Field of Classification Search ................ 438/22, 438/29, 82, 99; 257/23, 40, 81
See application file for complete search history.

(56) References Cited

U.S. PATENT DOCUMENTS

| | | | |
|---|---|---|---|
| 5,986,401 A | 11/1999 | Thompson et al. | 313/504 |
| 6,458,909 B1 | 10/2002 | Spreitzer et al. | 313/504 |
| 6,490,402 B1 | 12/2002 | Ota | 385/147 |
| 2003/0013220 A1* | 1/2003 | Lupo et al. | 438/29 |
| 2003/0117068 A1* | 6/2003 | Forrest et al. | 313/504 |

OTHER PUBLICATIONS

J.M. Shaw, P.F. Seidler, IBM Journal of Research & Development, 45(1), 3(2001).
C.W. Tang, and S.A. Vanslyke, Applied Physics Letter, 51,913(1987).
G. Czerremuszkin, M. Latreche and M.R. Wertheimer, WO03/005461, Transparent support for Organic Ligh.
A. Yasuda, W. Knoll, A. Meisel, T. Miteva, D. Neher, H.G. Nothfer and U. Scherf, EP 1, 149 827 (2000).

* cited by examiner

*Primary Examiner*—William M. Brewster

(57) ABSTRACT

This invention discloses structures of organic materials-based semiconductor devices and methods for the fabrication of such devices. According to this invention, each of the devices has a first part and a second part. The first part has at least a first organic semiconductor material layer deposited on a first electrode and the second part has at least a second organic semiconductor material layer deposited on a second electrode. Said device is formed by assembling the two individual parts together. Each part maybe fabricated separately and consists of an electrode coated with semi-conductor organic materials required by the function of the desired device. A schematic diagram in the FIG. 3 shows a first part (11) consisting of a first substrate (13), a first electrode (14) and at least one layer of organic materials (15); the second part (12) of the device consisting of the second substrate (16), a second electrode (17) with at least a layer of organic materials (18). The organic device (10) is finally obtained by combining the first part (11) with the second part (12) under controlled environment. This is preferably done by aligning the first part (11) onto the second part (12), and then by initiating a cross-link between organic material (15) and organic material (18) via heating, electron beam or light irradiation.

5 Claims, 9 Drawing Sheets

ORGANIC SEMICONDUCTOR DEVICES AND METHODS OF FABRICATION INCLUDING FORMING TWO PARTS WITH POLYMERISABLE GROUPS AND BONDING THE PARTS

FIELD OF THE INVENTION

This invention relates to structures of organic materials-based semiconductor devices and the methods of fabrication the same.

BACKGROUND OF THE INVENTION

From light emitting diodes, solar cells, sensors, transistors to many other semiconductor devices, organic materials with controllable electronic and opto-electronic properties are emerging as potential competitors to silicon, gallium aresenide and other inorganic semiconductor materials as the backbones of the semiconductor industry [J. M. Shaw, P. F. Seidler, IBM Journal of Research & Development, 45(1), 3(2001)].

A simple organic semiconductor device may consist of one layer of electro-opto active organic materials sandwiched between two electrodes. However in practice, many layers of organic semiconductor materials with different energy levels and functionalities are often required in order to improve the device performance. One typical example is an organic light-emitting device (OLED) [C. W. Tang, and S. A. Vanslyke, Applied Physics Letter, 51,913(1987)], as shown in FIG. 1. On a glass substrate (1), a layer of ITO (2) is first deposited. This ITO layer (2) will act as an anode. Then, a layer of hole-transport material (4) is applied onto the anode (2). Following a layer of organic semiconductor (5) is deposited onto the layer of hole-transport materials (4), a low work function material is deposited in a vacuum chamber by thermal evaporation or sputtering to form the cathode layer (6). Finally, a protective top layer (7) is applied in order to prevent oxygen or water molecules from reaching the low work function cathode layer (6). This protective top layer (7) may be a single layer of metal, glass, or multi-layers of metals and dense polymer. A power supply may now be connected to allow a current to flow into the organic semiconductor (5) through the ITO layer (2). The flow of the current leads to recombination of charge carriers in the organic semiconductor (5) to result in the emission of light (8). In this typical OLED device (9), layer (1) is the substrate, layer (2) is the anode, layer (4) is the hole-transport media, layer (5) is the light emitting organic materials, layer (6) is the cathode and layer (7) is the protective layer. In addition, other layers, such as a layer of hole-injection materials and/or a layer of electron-blocking materials may also be inserted between anode layer (2) and hole-transport layer (4), and/or a layer of electron-injection materials and/or a layer of electron-transport materials may be inserted between cathode layer (6) and light emitting organic semiconductor layer (5). These layers are chosen to have properties such as hole or electron transport, hole or electron blockage and light emission. Hence, it is clear that these devices, including (9) are multi-layer structured.

Currently, multi-layer structured organic devices such as (9) are conventionally constructed in a sequential manner. For instance in the case of polymeric light emitting diode (9), as shown schematically in FIG. 2. Firstly, a transparent electrode (2), usually indium-doped tin oxide (ITO) is first vacuum sputtered on a glass substrate (1). Secondly a hole-transport layer (4) such as poly (3,4-ethylene-dioxythiophene) (PEDOT) is coated onto the layer (2). Thirdly, a layer of light emitting polymer (5) such as poly[2-methoxy-5-(2-ethylhexyloxy)-1,4-phenylenevinylene] (MEH-PPV) is coating onto the layer (4), fourthly a top electrode (6) such as barium is thermally evaporated on layer (5) through a shadow mask. Finally, a protective layer (7) such as aluminium is deposited. The above fabrication steps yield a standard polymer light-emitting device with a layer structure of Glass/ITO/PEDOT/MEH-PPV/Ba/Al. The polymer (5) is commonly applied by spin coating or ink jet printing, while the electrodes (2, 6) are usually constructed by vacuum deposition or sputtering. Therefore, in this sequential fabrication process, both wet processes and dry processes are often required. One major drawback of this sequential fabrication is the requirements to integrate the wet processes and the dry processes, with total different working environments, into a single fabrication chamber. Even though various layers on top of each other can be processed by wet processing method, the choice of solvent still remains a problem, because the solvent used for one layer may attack the previously coated layer. Another drawback of the sequential fabrication of the successive layers to form the organic devices is the compatibility of the materials, specifically the ones for anode and cathode. Moreover, organic semiconductor devices, particularly these based on conjugated polymers, are amenable to a roll-to-roll process to minimize production costs. This sequential method is not flexible enough to meet the requirements for a roll-to-roll process, especially for the production of larger size flat devices. It is thus clear that a simple manufacturing process is highly valuable for the fabrication of these multi-layer organic semiconductor devices.

In the present invention, organic semiconductor devices containing two parts, each part formed on a substrate with different functional layers, are disclosed. By fabricating specific layers on each substrate before combining the two parts to form the organic semiconductor devices or circuits, the difficulties described above on the integration of wet and dry processes can be overcome and the fabrication cost can be reduced. The disclosed structure will allow the fabrication of each of the two parts to be standardized in a working environment or equipment which has been optimized individually for each part. These two parts can be then assembled in a specific way when needed. Hence, it is clear that the disclosed structure formed by a combinational approach will dissect a big project to various building blocks. This combinational approach will reduce the equipment requirements for the fabrication. More importantly, as compared to the sequential approach, this combinational method will ultimately provide the flexibility of varying combination possibilities of the final device. For example, if five different first parts and five different second parts are produced, up to twenty-five different devices configurations can be constructed. From the above description, it is evident that it is advantageous if an organic device can be constructed by combining two different parts for mass production.

OBJECT OF THE INVENTION

One objective of this invention is to provide an organic materials-based semiconductor device with two parts, a first part is formed on a first substrate with a first electrode and at least one first organic layer and a second part is formed on a second substrate with a second electrode and at least one second organic layer. These two parts are combined to form the final device. This combinatorial process provides versatility and flexibility in constructing organic materials-based semiconductor device. Another objective is to provide methods for fabrication of the organic materials-based semiconductor devices with two parts, particularly, methods of assembling the two parts into a single device.

DETAILED DESCRIPTION OF THE PREFERRED EMBODIMENTS

Figure 1:
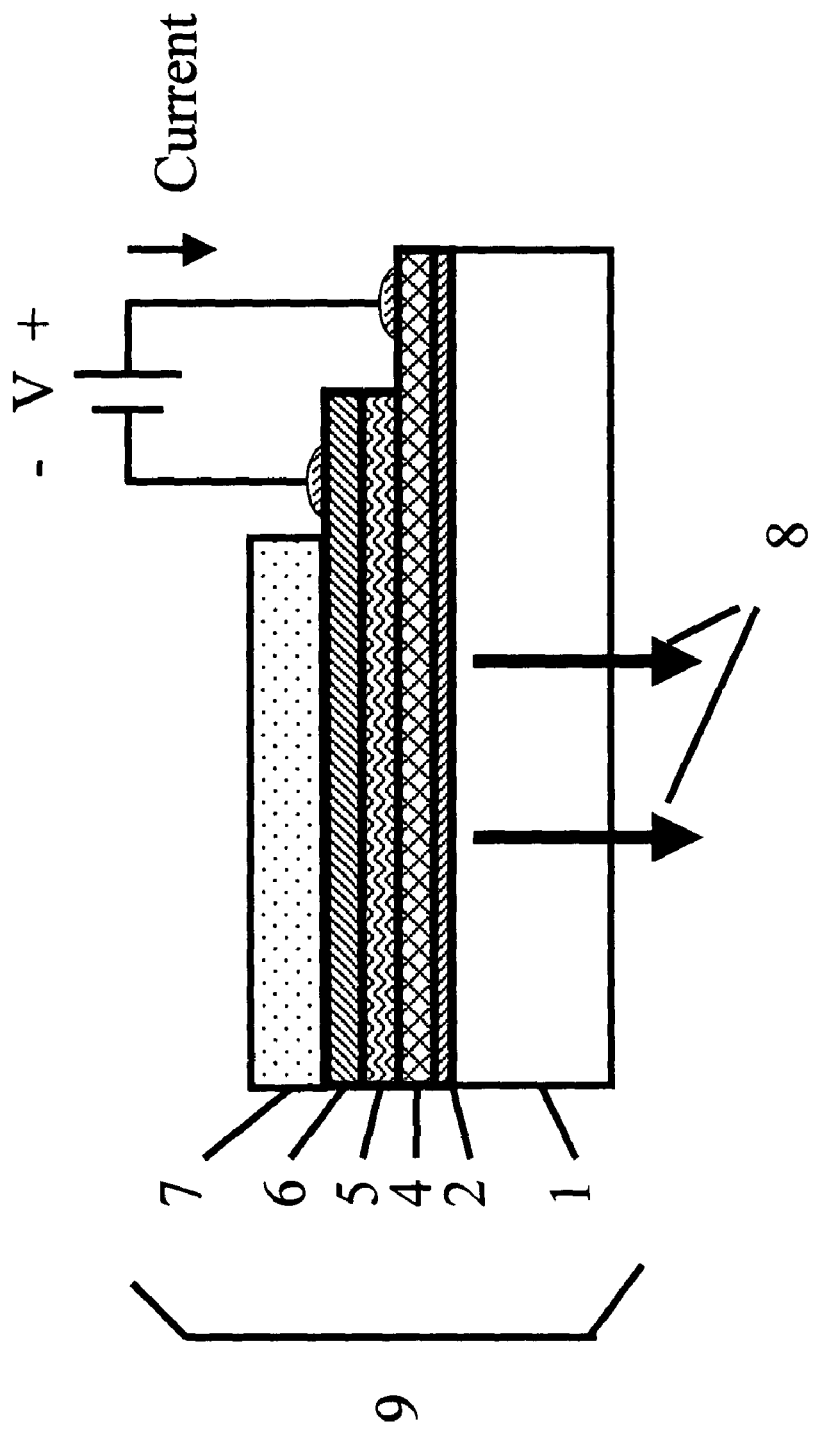
FIG. 1 shows a schematic cross-sectional view of an organic light-emitting device (9) with the bottom and top contact electrodes deposited by vacuum methods.
Figure 2:
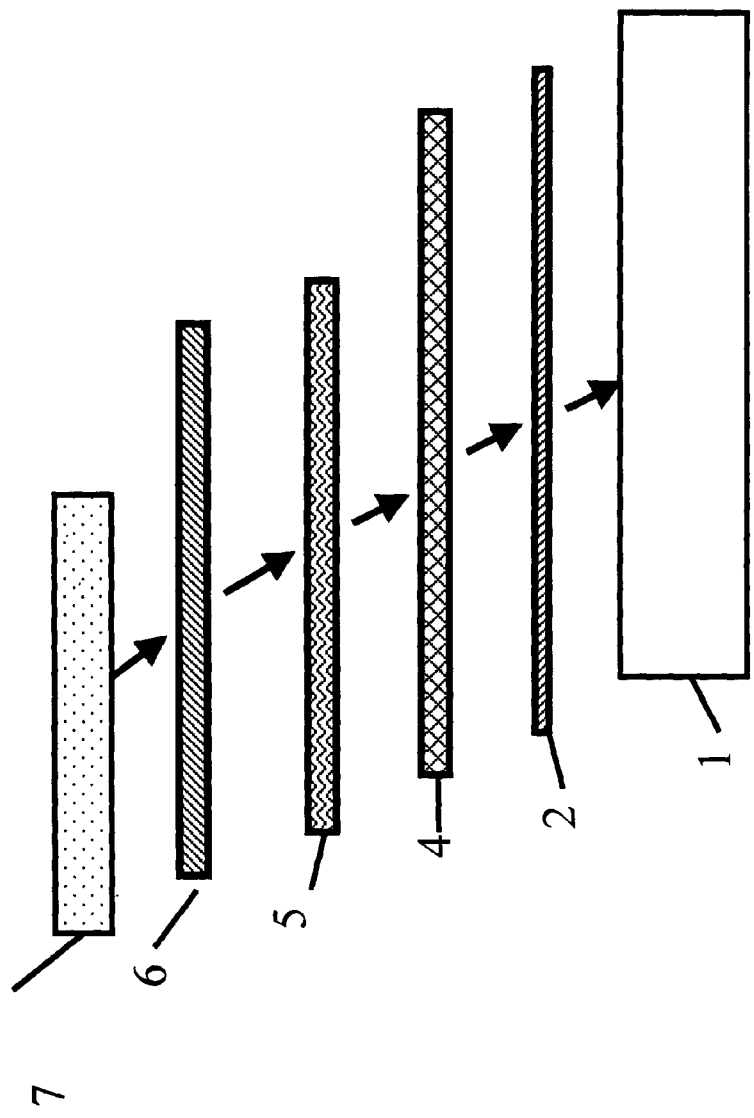
FIG. 2 shows a schematic cross-sectional view of individual layers of an organic device (9) using the sequential method.
Figure 3:
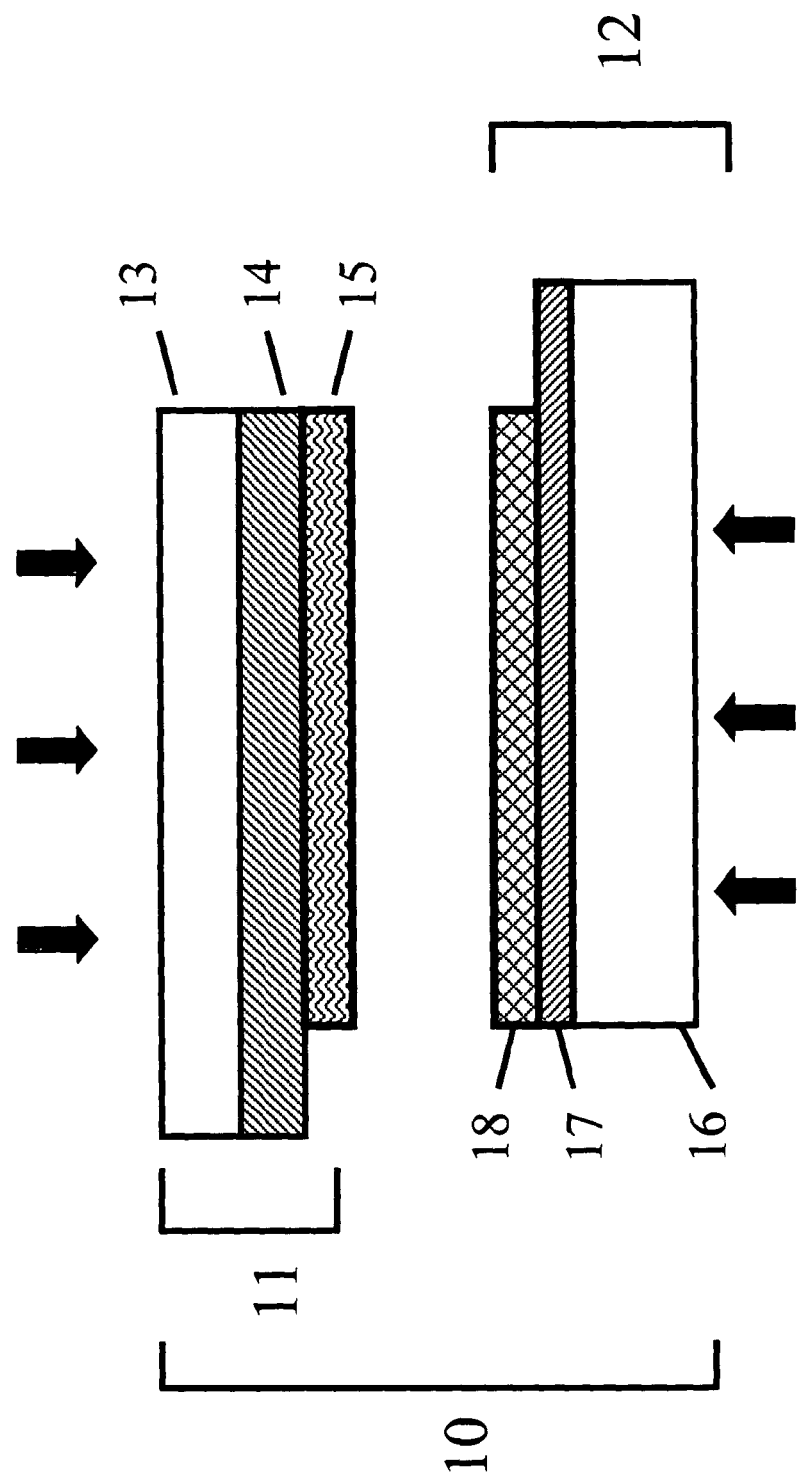
FIG. 3 shows a schematic diagram of an organic device (10) constructed by combining two parts (11, 12) according to this invention; each of the two parts (11, 12) is fabricated in a separate manner.

According to one embodiment of this invention, as schematically presented in FIG. 3, an organic semiconductor device (10) is constructed by combining (or assembling) a first part (11) and a second part (12) together. The first part (11) consists of a first substrate (13), a first electrode (14) and at least one layer of first organic semiconductor materials (15). The second part (12) consists of a second substrate (16), a second electrode (17) and at least one layer of second organic materials (18). The organic semiconductor device (10) is obtained by combining the first part (11) with the second part (12) under controlled environment. This is done by bring the first part (11) towards the second part (12) to initiate linking between the first organic material (15) and the second organic material (18).

In FIG. 3, the first substrate (13) and the second substrate (16) maybe selected from a group of rigid materials such as glass, alumina, aluminium, brass, stainless steel sheet, etc., or from a group of flexible materials such as polymeric sheets like polyester, polycarbonate, polyamide, and textile fabrics, etc. The selection of these substrates depends on the desired functionality of the device. For example, in the case of OLED or other optical devices, al least one of the two substrates (13, 16) shall be transparent to permit optical signal passing through. If the first substrate (13) is transparent, a bottom emission OLED may be constructed, while if the second substrate (16) is transparent, a top emission OLED may be fabricated. Furthermore, if both substrates are transparent, a transparent OLED may be formed [M. E.Thompson, S. R. Forrest, and P. Burrows, U.S. Pat. No. 5,986,401, High Contrast Transparent Organic Light Emitting Device Display]. In addition, if flexible materials are selected for both substrates, a flexible and foldable device may be constructed [Takaaki, Ota, U.S. Pat. No. 6,490,402, Flexible Flat Colour Display]. For a long-lived device, the air or moisture permeability of these substrates shall be considered as well [G. Czerremuszkin, M. Latreche and M. R. Wertheimer, WO03/005461, Transparent support for Organic Light Emitting Device]. It is noted that in certain cases, one or both substrates (13, 16) may be omitted depending on the electrode layers (14, 17) used.

In FIG. 3, according to this invention, the first electrode layer (14) and the second electrode layer (17) represent the cathode and the anode of the device (10) respectively. Their energy levels and electrical conductivity shall be first considered to facilitate charges flowing through the device (10). For the case of OLED, low work function materials such as metals (lithium, magnesium, calcium, nickel, etc.), alloys and salts (LiF, $CaF_2$, $MgF_2$, etc.) are preferable for layer (14) to act as the cathode, whereas high work function materials such as metals (platinum, gold, copper, silver, etc.), and metallic oxide (ZnO, $TiO_2$, ITO, etc.) are preferred for the second electrode layer or anode (17). Optical transmission properties and compatibility of the electrodes (14, 17) shall be considered according to the selection of the first substrate (13) and the second substrate (16). For instance, if the second substrate (16) is glass, a transparent and electrically conductive material like ITO is more preferable for the second electrode layer or the anode (17).

Commercially available transparent substrates with a transparent electrode layer, for example ITO coated glass, can be selected for the construction of the second part (12) of device (10). In such cases, the glass will act as the substrate (16) and the ITO layer will act as the anode (17). Similarly, a metallic sheet like nickel, stainless steel may be preferable for the cathode (14), where this metallic sheet will act as both the cathode (14) and the substrate (13).

When a substrate with an electrode layer deposited is not commercially available, it may be constructed via either a vacuum or a non-vacuum processing. For the vacuum fabrication process, the formation of the second anode (17) on the second substrate (16) and the formation of the first electrode layer (14) onto the first substrate (13) may be accomplished by chemical vapour deposition, vacuum deposition, sputtering or spray pyrolysis. Using a non-vacuum process, the fabrication of electrodes may be achieved by electrolysis, spin coating, ink jet printing and other non-vacuum techniques.

According to another embodiment of this invention, after the formation of the first electrode (14) on the first substrate (13) and the formation of the second electrode (17) on the second substrate (16), at least a layer of the first organic materials (15) is then applied onto the front surface of the first electrode (14) and a layer of the second organic materials (18) is applied onto the second electrode (17). The selection of the first and the second organic materials (15, 18), either small molecules or macromolecules, is dependent on the functions of device (10) to be fabricated. More layers of organic materials (15', 15" . . . not shown in FIG. 3) may be deposited on the first layer of organic material (15). Similarly, more layers of organic materials (18', 18" . . . not shown in FIG. 3) may be deposited on the second layer of organic material (18). The deposition methods of these organic materials depend mainly on the nature of the organic materials selected. A conventional solution processing technique including spin coating, ink jet, screen-printing, thermal transfer printing, etc., is preferred.

Figure 4:
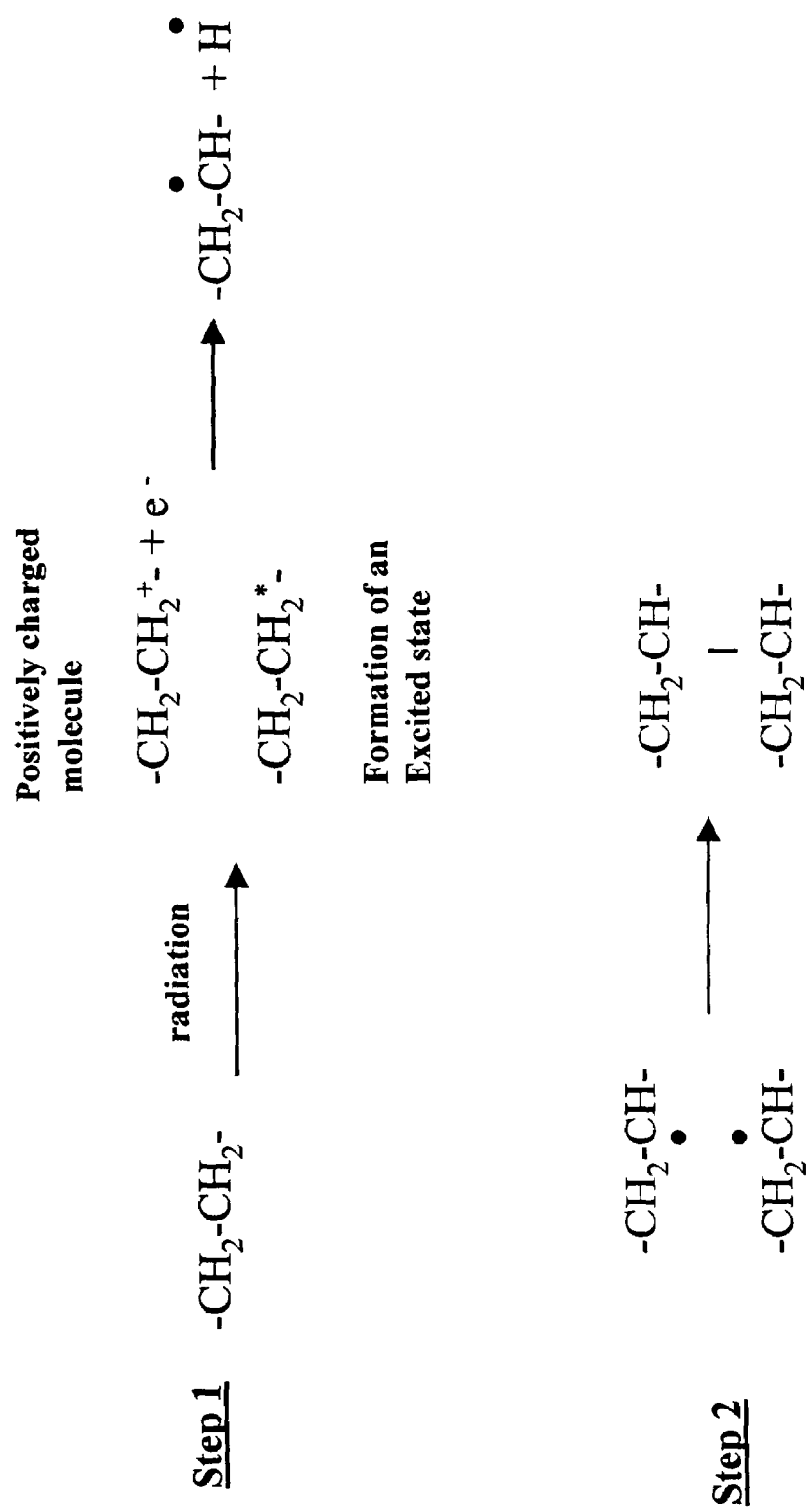
FIG. 4 is a schematic diagram showing electron-beam-induced cross-linking of alkanes.

Clearly, it is important to select the correct organic materials for the construction of these organic layers (15, 15' 15" . . . or 18, 18' 18" . . . ). The combination of these layers will determine the functionalities of the final organic semiconductor device fabricated. The first organic material layer (15) and the second organic material layer (18) can be a single chemical component or a mixture of different chemical components. These two layers can have the same chemical composition or different chemical compositions. The layer or layers of organic materials should have the required electronic or electro-opto functions, and they should also prevent the low work function electrode (14) from oxidization. More preferably, the selected first organic materials (15) for the first part (11) shall be able to chemically cross-link with the second organic materials (18) for the second part (12). Hence, the first organic material layer (15) of the first part (11) shall have the first reactive groups (r1), and the second organic material layer (18) of the second part (12) shall have the second reactive groups (r2). These two reactive groups are selected so that they can react to each other under controlled conditions. The first reactive group (r1) and the second reactive group (r2) can be the same or different as long as they can react to each other under controlled conditions. The controlled conditions may include temperature, pressure, and irradiation. Preferably, the reaction between reactive groups (r1) and reactive group (r2) is polymerization. In this case, reactive groups (r1) and reactive group (r2) are called polymerisable groups. More preferably, this polymerization can be initiated by heating, electron-beam or UV-irradiation. FIG. 4 demonstrates the electron beam induced cross-linking mechanism of two alkyl groups. Electroluminescent polymers usually have flexible aliphatic side groups, which are necessary to increase the solubility of the polymer in common organic solvents. As shown in the first step of FIG. 4, when alkyl groups are radiated by an electron beam or light beam, positively charged molecules or excited molecules are formed which lead to the formation of free radicals. In the second step of FIG. 4, these radicals react with each other and lead the formation of cross-links between these alkyl groups.

Figure 5:
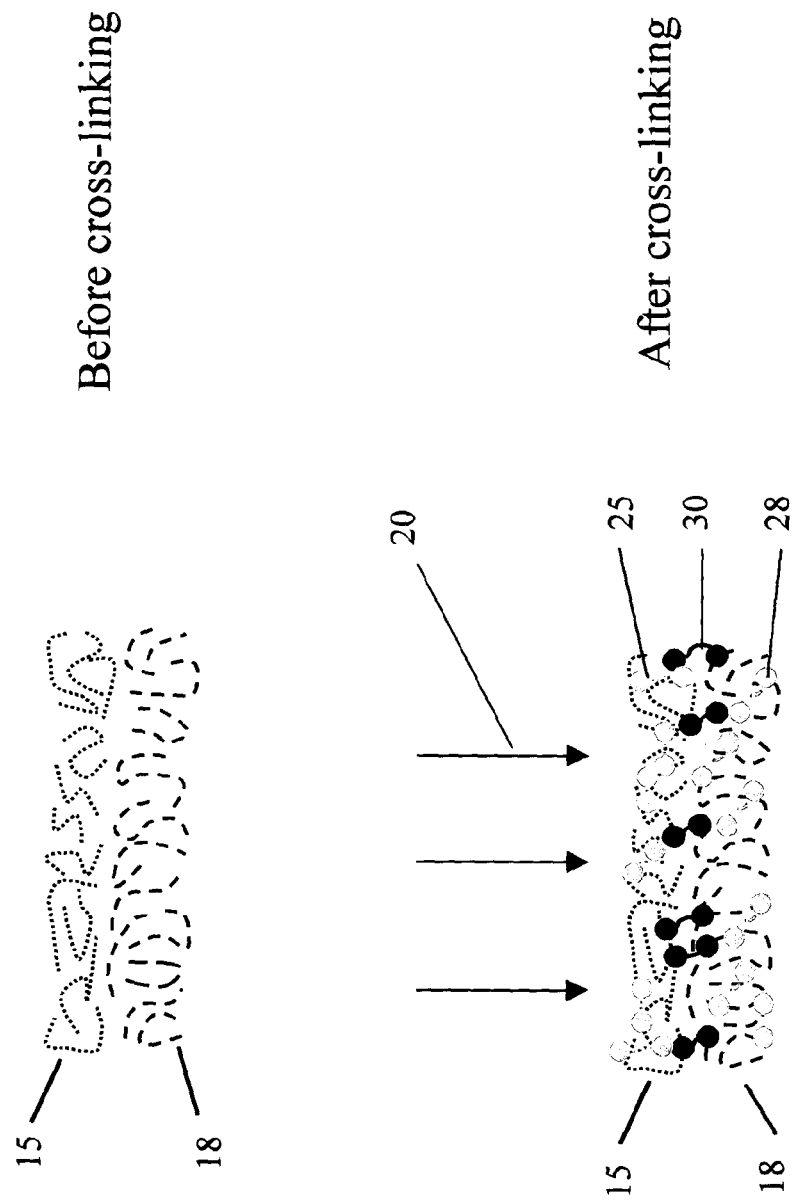
FIG. 5 is a schematic diagram showing molecular arrangement both before and after cross-linking.

Cross-links form bridges among molecules and tie all the polymer chains together to generate one giant super-molecule. FIG. 5 is a schematic diagram that shows the formation of bridges between polymeric material (15) and polymeric material (18), where the polymeric material (15) represents the first organic material in the first part (11) and the polymeric material (18) represents the second organic material in the second part (12). In the figure, arrows (20) symbolize the initiation of cross-links due to heating, electron-beam or light radiation. While (25) represents bridges formed among the molecules in the first organic material (15), (28) represents bridges formed among the molecules in the second organic material (18), and (30) represents bridges formed between the molecules in the first organic material (15) and the molecules in the second organic material (18). When molecules in the two organic materials (15 and 18) become cross-linked, a lot of single uncross-linked molecular chains wove together and form a cross-linked network, which chemically bond the two layers (15 and 18) together.

In principle, any functional groups, which can react to each other, can be selected as a polymerisable group. However, the polymerisable or reactive groups (r1 or r2) are preferably selected from alkyl, acrylate, epoxy, vinyl, vinyl ether, oxethane, acrylnitrile, urethane, amino, hydroxyl, halide, isothiocynate, isocynate, nitrile, and others. The selection of reactive group (r1) or reactive group (r2) may be independent, but a reaction-compatibility shall be considered. A preferable coupling or polymerization system includes, but not limited to, acrylate/acrylate, hydroxy/isothiocynate, vinyl ether/acrylate, vinyl ether/vinyl ether, epoxy/epoxy, epoxy/vinyl ether, epoxy/acrylate, epoxy/acrylate/vinyl ether, and many others. Catalysts and/or photo initiators may be incorporated into the formulation of the first organic materials (15) and the second organic materials (18), respectively. The selection and use of catalysts and/or photo initiators depend mainly on the nature of the reactive groups (r1 and r2). But, a polymerization system with photoinitiator-free and catalyst-free is much more preferable.

According to the above detailed description, the first part (11) of device (10) is now constructed, which consists of the first substrate (13), the first electrode (14) and at least a layer of the first organic materials (15). Similarly, the second part (12) is now constructed, which consists of the second substrate (16), the second electrode (17) and at least a layer of the second organic materials (18).

According yet another embodiment of this invention, a device (10) is assembled by bringing the first part (11) and the second part (12) together and promoting the cross-linking of organic materials in said two parts (11 and 12) subsequently. It is thus clear that the key features of the organic device (10) according to this invention are the two parts (11,12), and assembling the two parts (11, 12) to form an integral organic semiconductor device (10), with the assistance of cross-linking or coupling between the molecules. The coupling of the two parts (11, 12) is through polymerization or cross-linking of the two polymerisable materials (15, 18) previously coated on each of the two parts (11, 12), providing a good interlayer adhesion in the two parts (11, 12) and the evenness of the interfaces.

A combination of substrates (13 and 16), electrodes (14 and 17), chemical composition of organic materials for each layer (15 and 18) would define the function of the organic semiconductor device (10) fabricated. The organic semiconductor devices (10) which may be fabricated according to this invention include but not limited to organic thin film transistor (OTFT), organic photo-voltaic (OPV) devices for solar cell application or detection, organic solid state laser or organic solid state lighting (OSSL), organic thin film memory (OTFM) for data storage, organic sensor (OS) for bio-application and chemical detection, organic light emitting diode (OLED) for flat panel applications and others.

For example in the case of a typical polymer light emitting device, the first part (11) may be constructed by selecting silver as the first substrate (13), magnesium as the first electrode (14), and a polymerisable light emitting polymer (LEP) as the first layer of organic material (15), forming a layer structure of Ag/Mg/LEP; the second part (12) may be constructed by selecting glass as the second substrate, ITO as the second electrode (17), and a layer of polymerisable hole transport polymer (HTP) as the second organic materials (18), forming a layer structure of HTP/ITO/Glass. Aligning the first part (11) on top of the second part (12) and inducing the cross-linking between the LEP and HTP will result in a polymer light emitting device with a layer structure of Glass/ITO/HTP/LEP/Mg/Ag, where HTP stands for hole transport polymer such as polyaniline, polythiothene, polypyrole, etc, and LEP stands for light emitting polymer such as polyfluorenes [A. Yasuda, W. Knoll, A. Meisel, T. Miteva, D. Neher, H. G. Nothfer and U. Scherf, EP 1, 149 827 (2000), End-capped polyfluorenes, film and devices based thereon], polyphenylvinylenes [H. Spreitizer, W. Kreuder, H. Becker, H. Schoo, and R. Demandt, U.S. Pat. No. 6,458,909 (2002), Aryl-substituted poly(p—arylenevinylenes), process for their preparation and their use in electroluminescence components], and others.

In the subsequent part of this invention, some examples on the fabrication of OLEDs and TFT are given. It is clear that these examples are presented for illustration purposes and not presented to limit the scope of this invention.

EXAMPLES

Example 1

The Formation of the First Part (11) with a Light-Emitting Polymer

Figure 6:
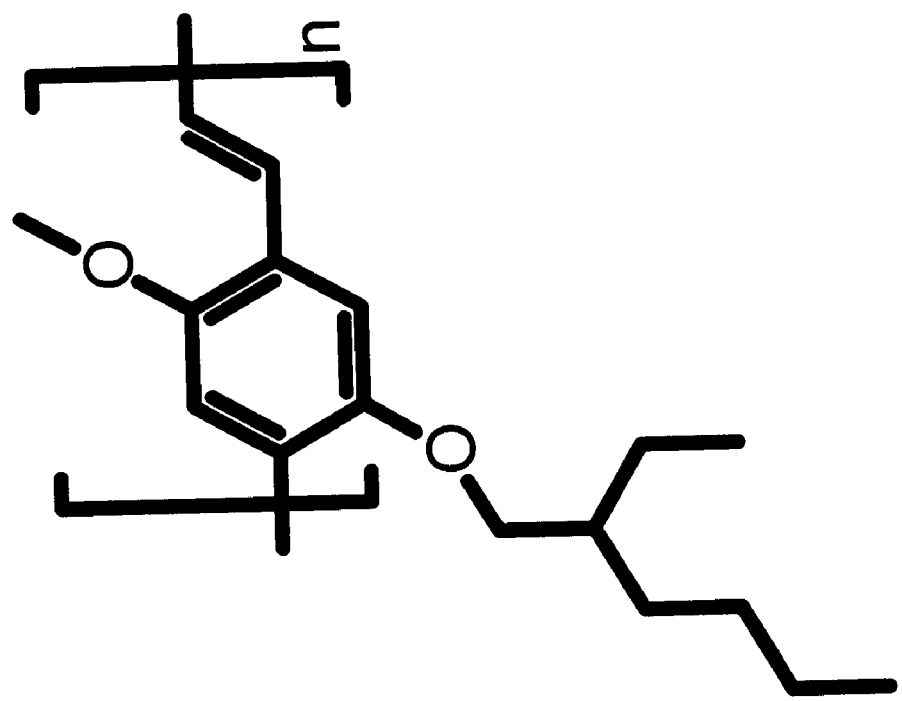
FIG. 6 shows chemical structures of typical materials used in examples of this invention: (a) MEH-PPV used in examples 1, 5 and 7, (b) PFO-VE used in example 4, (c) P3BT-VE used in example 6 and (d) PCBM used in example 6.

A layer of nickel was first deposited onto a glass substrate by conventional coating methods. Then onto the top surface of nickel, a layer of semiconducting polymer MEH-PPV (structure shown in FIG. 6(a)) is spin-coated from a 1% wt./v of MEH-PPV in toluene at 2000 rpm. A low temperature heat treatment of the sample with the semiconducting polymer is now carried out to vaporize the solvent trapped within the polymer and to improve the molecule arrangement within the film. The heat treatment may be carried out in an inert atmosphere at a temperature in a range of 80° C. to 120° C., for a period ranging from 30 minutes to about 120 minutes, depending on the type of polymer used. This completes the construction of the first part (11) of an organic semiconductor device (10) that consists a nickel cathode covered by a semiconductor polymer, i.e. Glass/Ni/MEH-PPV, where the glass is the first substrate (13), nickel cathode is the first electrode (14) and the MEH-PPV layer makes up the first organic material layer (15), according to FIG. 3.

Example 2

The Construction of the Second Part (12) with a Hole Transport Layer

In a chamber with flowing inert gas such as nitrogen, argon or a mixture of them, a commercial ITO-coated glass is pre-cleaned by a conventional technique. A layer of PEDOT is then spin-coated onto the ITO-coated glass from a commercially available PEDOT solution. This PEDOT-coated ITO glass will serve as the second part (12) of the organic semiconductor device (10), where the glass is the second substrate (16), ITO is the second electrode (17) and PEDOT makes up the second organic material layer (18) according to FIG. 3.

Example 3

The Construction of an OLED

Example 1 provides the construction of the first part (11) of an organic semiconductor device (10). It consists of the first glass substrate (13), the first electrode (14) and the first organic semiconductor material (15), with a structure of Glass/Ni/MEH-PPV. Example 2 provides the second part (12) of an organic semiconductor device (10) and it has a structure of Glass/ITO/PEDOT, where the glass is the second substrate, ITO is the second electrode (17) and the PEDOT is the second organic semiconductor material (18). An OLED device (10) is then fabricated by stacking the first part (11) with the second part (12), and this delivers a final device structure of Glass/ITO/PEDOT/MEH-PPV/Ni/Glass. To have a better interface contact between the first part (11) and the second part (12), the two parts may be pressed while being heated. A conventional encapsulation with epoxy resin is finally carried out before the further characterization of this OLED.

Example 4

Heating Induced Cross-Linking of Conductive Polymers

Figure 6B:
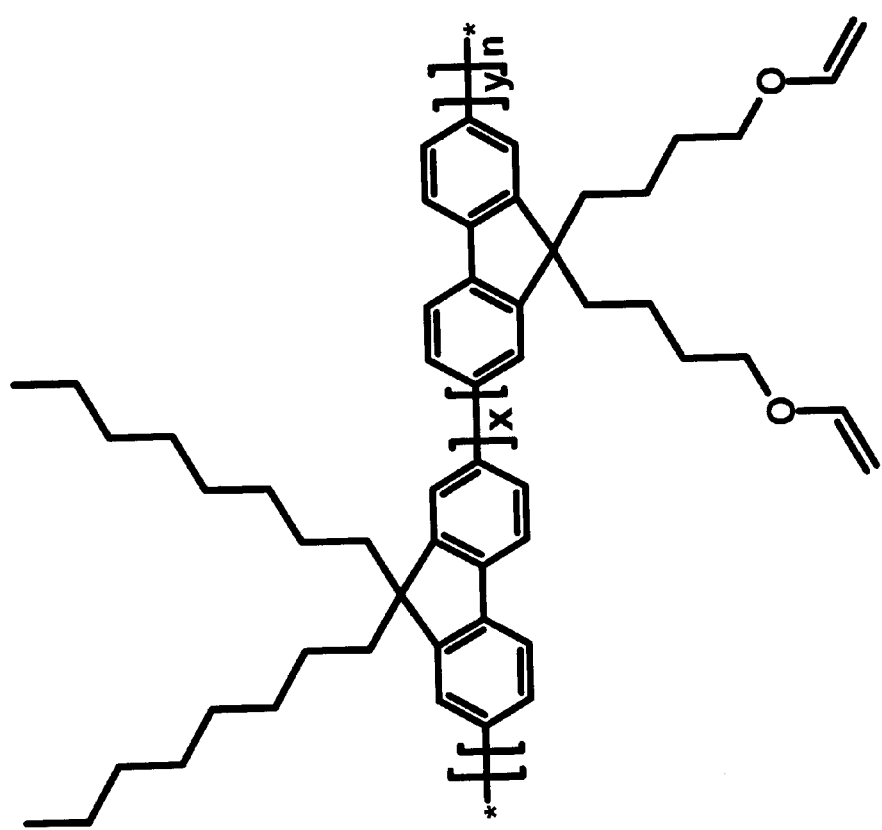

In this example, the first part (11) is fabricated in a way similar to the one described in example 1 except that a conjugated co-polymer, poly[(9,9-dioctylfluorenyl-2,7-diyl)-co-(9,9-di-{vinyloxybutyl}-fluorenyl-2,7'-diyl)] (PFO-VE, structure shown in FIG. 6(b)) is used to replace the MEH-PPV used in example 1, forming the first part (11) with a layer structure of Glass/Ni/PFO-VE.

The second part (12) in this example is fabricated in a manner similar to the one described in example 2. After a layer of PEDOT is spin-coated onto an ITO/glass electrode, a layer of PFO-PE is applied onto the PEDOT layer and this forms the second part (12) with a layer structure of Glass/ITO/PEDOT/PFO-VE.

After the first part (11) is properly placed onto the top of the second part (12), the whole assembly is heated in a nitrogen-filled chamber to a temperature of 100° C. for 30 minutes. Thus an OLED device (10) with a layer structure of glass/ITO/PEDOT/PFO-VE/Ni/Glass is obtained.

Example 5

Electron-Beam Induced Cross-Linking of Conductive Polymers

This example is given to demonstrate an OLED device (10) fabricated by electron beam induced cross-linking of electroluminescent polymers. When flexible aliphatic side groups, for example 2-ethylhexyl in MEH-PPV (structure shown in FIG. 6(a)), are subjected to high-energy radiation, such as electron beam, charged and excited species are formed, which lead to the formation of free radicals. These radicals can then react and lead to the formation of cross-links as shown in FIG. 5.

In this example, the first part (11) with a layer structure of Glass/Ni/MEH-PPV is fabricated in a way similar to that described in example 1. The second part (12) is fabricated in a way similar to example 2, except that after PEDOT is spin-coated onto the ITO/glass electrode (17), a layer of MEH-PPV is applied onto the PEDOT. This forms the second part (12) with a layer structure of Glass/ITO/PEDOT/MEH-PPV.

After the first part (11) is properly placed onto the top of the second part (12), the whole assembly is subjected to an electron-beam radiation in a compact electron-beam processor under dry nitrogen atmosphere. Thus an OLED device (10) with a layer structure of Glass/ITO/PEDOT/MEH-PPV/Ni/Glass is obtained.

Example 6

A Plastic Solar Cell Fabricated from Cross-Linkable Conductive Polymers

Figure 6C:
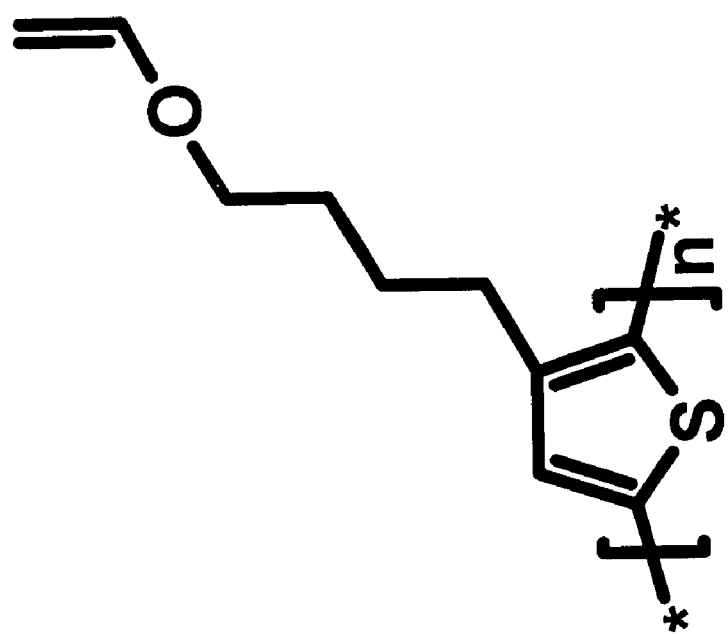
Figure 6D:
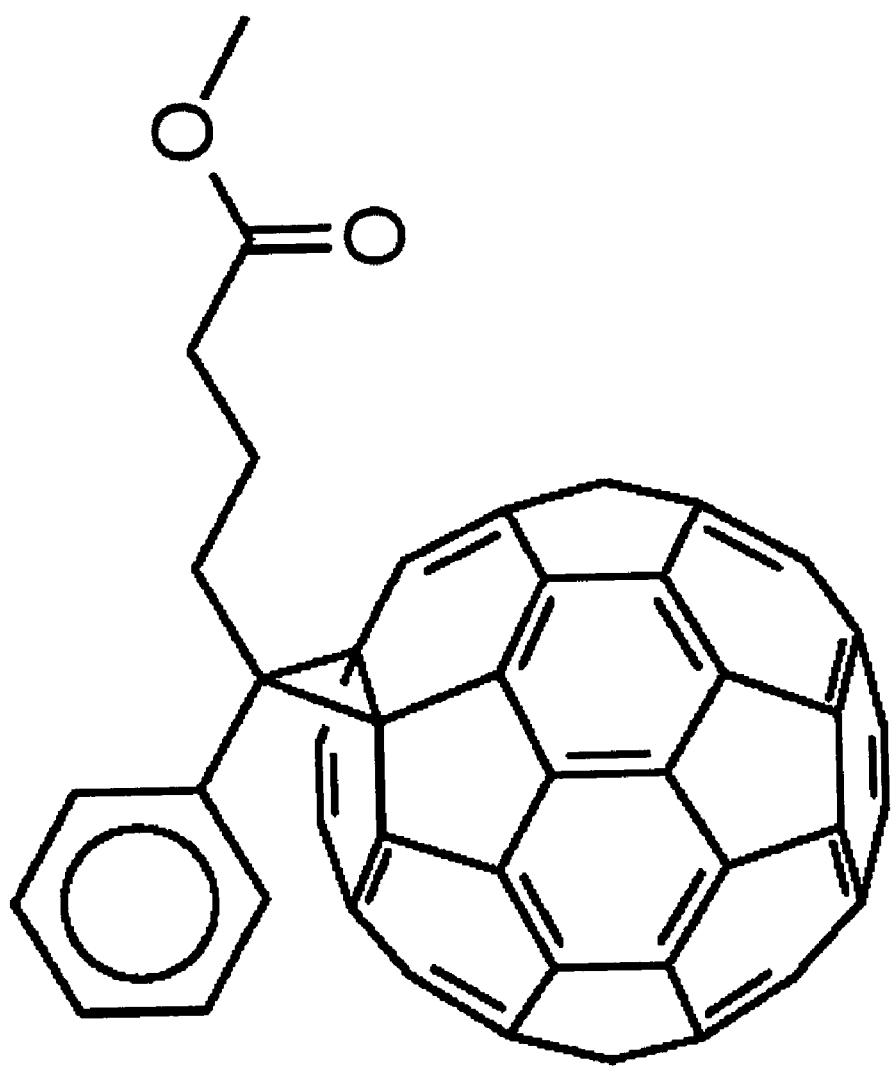

In this example, a bulk heterojunction of polymer/fullerence solar cell based on poly (3-vinyloxybutyl-thiophene-2,5diyl (P3BT-VE, structure shown in FIG. 6(c)), as an electron donor, and a soluble fullerecne derivative [6,6]-phenyl-C61 butyric acid methyl ester (PCBM, structure shown in FIG. 6(d)), as an electron acceptor, is formed according to this invention. The first part (11) with a layer structure of Au/Al/P3BT-VE:PCBM is prepared by deposition of aluminium onto the front surface of a thin gold sheet.

This is followed by spin-coating a layer of P3BT-VE/PCBM onto the top of the aluminium layer from a mixture of P3BT-VE/PCBM (at a 1:4 mass ratio), dissolved in a chloroform-toluene solvent mixture (at 0.25 wt/%). A spinning speed of 4000 rpm is applied to yield a thin film with a thickness of about 100 nm. The second part (12) with a layer structure of ITO/PEDOT/P3BT-VE:PCBM is prepared by first spin-coating a thin layer of PEDOT (Baytron P, Bayer AG, Germany) on a patterned clean ITO-coated glass substrate. This is followed by deposition of a thin P3BT-VE/PCBM layer onto the PEDOT layer. By properly stacking the first part (11) onto the second part (12), and then cross-linking the two parts (11, 12) via heating, a bulk heterojunction of polymeric solar cell (10) with a layer structure of ITO/PEDOT/P3BT:PCBM/Al is fabricated.

Example 7

An OLED Device Fabricated Via Conventional Method as a Reference Sample for Comparison For comparison, the conventional fabrication procedure for a standard device configuration: ITO/PEDOT/MEH-PPV/Nickel/Glass is given below.

A 130-nm-thick layer of PEDOT is first spin-coated (at 2000 rpm) onto pre-cleaned ITO-glass substrates. After that, a light-emitting polymer (MEH-PPV) with a thickness of about 80 nm is spin-coated at room temperature under ambient conditions from a toluene/THF solution. The solvent is then thoroughly removed by subsequently baking the samples on a hot plate. The Ni cathode (50 nm thick) is then deposited through a shadow mask at a chamber base pressure of $<10^{-6}$ torr. Finally, a glass substrate is stacked onto the nickel layer with adhesive. This yields a standard OLED device with a layer structure of ITO/PEDOT/MEH-PPV/Ni/Glass, which is identical to the one prepared in example 3 according to this invention.

What is claimed is:

1. A method to fabricate an organic electronic and opto-electronic device comprising
    preparing a first part with at least a layer of a first organic material containing a first polymerisable group,
    preparing a second part with at least a layer of a second organic material containing a second polymerisable group and subsequently contacting the first polymerisable group with the second polymerisable group,
    bonding said first part to said second part under an environment with controlled parameters, wherein said bonding of said first part and said second part is achieved by cross-linking between said first polymerisable group and said second polymerisable groups to form an active layer of an opto-electronic device.

2. A method to fabricate an organic electronic and opto-electronic device as defined in claim 1, wherein said first polymerisable group is the same as said second polymerisable group.

3. A method to fabricate an organic electronic and opto-electronic device as defined in claim 1, wherein said first polymerisable group is different from said second polymerisable group.

4. A method to fabricate an organic electronic and opto-electronic device as defined in claim 1, wherein said first polymerisable group and said second polymerisable group are selected from a group of alkyl, acrylate, epoxy, vinyl, vinyl ether, oxethane, acrylnitrile, urethane, amino, hydroxyl, halide, isothiocynate, isocynate, nitrile, or a mixture of at least two of the above.

5. A method to fabricate an organic electronic and opto-electronic device as defined in claim 1, wherein said controlled parameters of said environment include heating, electron beam radiation or light lamination.

* * * * *